United States Patent
Chen

(10) Patent No.: US 9,231,604 B2
(45) Date of Patent: Jan. 5, 2016

(54) MULTI-PHASE CLOCK GENERATOR

(71) Applicant: Shanghai Huahong Grace Semiconductor Manufacturing Corporation, Shanghai (CN)

(72) Inventor: Danfeng Chen, Shanghai (CN)

(73) Assignee: Shanghai Huahong Grace Semiconductor Manufacturing Corporation, Pudong, Shanghai (CN)

( * ) Notice: Subject to any disclaimer, the term of this patent is extended or adjusted under 35 U.S.C. 154(b) by 0 days.

(21) Appl. No.: 14/582,634

(22) Filed: Dec. 24, 2014

(65) Prior Publication Data

US 2015/0303930 A1    Oct. 22, 2015

(30) Foreign Application Priority Data

Apr. 22, 2014    (CN) .......................... 2014 1 0161195

(51) Int. Cl.
*H03L 7/06* (2006.01)
*H03L 7/093* (2006.01)

(52) U.S. Cl.
CPC ....................................... *H03L 7/093* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 2014/0021987 A1* | 1/2014 | Okada | ........................... | 327/156 |
| 2014/0120847 A1* | 5/2014 | Shima | .............................. | 455/73 |
| 2014/0266342 A1* | 9/2014 | Arai et al. | ..................... | 327/156 |
| 2015/0214966 A1* | 7/2015 | Tong et al. | .................... | 327/157 |

\* cited by examiner

*Primary Examiner* — Adam Houston
(74) *Attorney, Agent, or Firm* — Harness, Dickey & Pierce, P.L.C.

(57) ABSTRACT

Embodiments provide a multi-phase clock generator. The clock generator includes a loop oscillator, a RC filter, a bias current source and a frequency injection source. The loop oscillator includes N levels of CMOS phase inverters which are connected in series and form a loop, N represents an odd number greater than 1. The N levels of CMOS phase inverters have the same structures, each of which includes a CMOS phase inverter main body and a tail current source which is a current mirror of the bias current source. As an effect of RC filter, a clock input signal inputted by the frequency injection source is applied to the first level tail current source, while other tail current sources are not influenced. Injection locking is induced, such that phase noise and frequency stray can be reduced.

15 Claims, 3 Drawing Sheets

MULTI-PHASE CLOCK GENERATOR

CROSS REFERENCE TO RELATED APPLICATIONS

The present application claims priority to Chinese Patent Application No. 201410161195.8, filed on Apr. 22, 2014 and entitled "MULTI-PHASE CLOCK GENERATOR", the entire disclosure of which is incorporated herein by reference.

FIELD OF THE DISCLOSURE

The present disclosure generally relates to semiconductor integrated circuits, and more particularly, to a multi-phase clock generator.

BACKGROUND OF THE DISCLOSURE

Multi-phase clock generators are widely used in both analogue and digital circuits, especially in high-speed and high-performance digital circuits. Conventionally, locked phase technology is used for generating multi-phase clock signals. Locked phase technology, adapted for automatic phase control, has been developed for 100 years and widely used in electronic systems like communications, navigations, radars, computers and domestic appliances. In general, a Phase Locked Loop (PLL) is used to implement the phase control. In some occasions, the PLL may be replaced by a Delay Locked Loop (DLL) in which a voltage controlled oscillator originally configured in the PLL is removed, while a Voltage Controlled Delay Line (VCDL) may be used for delaying an input clock signal for several cycles and then outputting the delayed clock signal. Therefore, synchronization between the input and the output signals can be achieved. For the PLL, as a voltage controlled oscillator is used, which is very sensitive to interference and noise from the power supply or substrate, it may have unacceptable stability and shake resistance.

Currently, for outputting clock signals with high performance, generally a DLL is applied. A DLL can generate and output a multi-phase clock with the same frequency as the reference signal, after the locking. The multi-phase clock can be used to eliminate clock delay, or being transferred into a high-frequency clock or a low-frequency clock through a frequency multiplier or a frequency divider. FIG. 1 schematically illustrates the structure of an existing DLL. The DLL includes a phase detector (PD) 101, a charge pump (CP) and loop filter (LPF) 102, and a VCDL 103. The PD 101 is used for detecting phases of an input signal Fin and an output signal Fout, and then outputting a corresponding detection signal $V_{PD}$, which indicates to upraise or lower down the signal phase. Under control of the detection signal $V_{PD}$, the charge pump performs a charging or discharging operation, which eventually becomes a control voltage $V_{CTRL}$ through the LPF. The control voltage $V_{CTRL}$ then comes to the VCDL 103 which includes a plurality of multi-level delay units connected in series. The input signal Fin is inputted to the VCDL 103, delayed by the multi-level delay units, and outputted by the VCDL 103 as the output signal Fout. During the above process, the voltage $V_{CTRL}$ can adjust the delay periods of the multi-level delay units of the VCDL 103. Further, by using the negative feedback control through the whole loop, the phase difference between the input signal Fin and the output signal Fout after the locking can be maintained as one cycle.

DLL has advantages like smaller jitters and less noise. However, due to the usage of the charge pump, phase noise is inevitable.

BRIEF SUMMARY OF THE DISCLOSURE

Embodiments of the present disclosure provide a multi-phase clock generator which can realize phase locking using injection locking, such that phase noise can be reduced and clock frequency stray may be effectively relieved.

According to one embodiment, a multi-phase clock generator is provided. The clock generator includes a loop oscillator, a resistance-capacitance (RC) filter, a bias current source and a frequency injection source;

wherein the loop oscillator includes N levels of CMOS phase inverters which are connected in series and form a loop, N represents an odd number greater than 1;

wherein the N levels of CMOS phase inverters have the same structures, each of which includes a CMOS phase inverter main body and a tail current source which is a current mirror of the bias current source;

wherein an input end of the $i^{th}$ level CMOS phase inverter is connected to an output end of the $(i-1)^{th}$ level CMOS phase inverter, an output end of the $i^{th}$ level CMOS phase inverter is connected to an input end of the $(i+1)^{th}$ level CMOS phase inverter, and an input end of the first level CMOS phase inverter is connected to an output end of the $N^{th}$ level CMOS phase inverter, i represents an integral number greater than 1 and less than N;

wherein the RC filter includes a first capacitor and a first resistor;

wherein the frequency injection source is adapted for inputting a clock input signal which is then injected through the first capacitor to the tail current source of the first level CMOS phase inverter;

wherein the clock input signal is isolated, by the RC filter, from the bias current source and the tail current sources of the CMOS phase inverters from the second level to the $N^{th}$ level of the loop oscillator;

wherein the loop oscillator outputs a clock output signal whose frequency is the same as a frequency of the clock input signal inputted by the frequency injection source under the effect of injection locking.

Optionally, each of the CMOS phase inverter main bodies includes a first NMOS transistor and a first PMOS transistor, and each of the tail current sources includes a second PMOS transistor;

wherein gates of the first NMOS transistor and the first PMOS transistor are connected to a node which also serves as the input end of the CMOS phase inverter, drains of the first NMOS transistor and the first PMOS transistor are connected to a node which also serves as the output end of the CMOS phase inverter, and a source of the first PMOS transistor is connected to a drain of the second PMOS transistor;

wherein sources of the first NMOS transistors of the N levels of CMOS phase inverters are connected and grounded;

wherein sources of the second PMOS transistors of the N levels of CMOS phase inverters are connected to a power supply voltage;

wherein gates of the second PMOS transistors of the CMOS phase inverters from the second level to the $N^{th}$ level are connected to a node which is connected to a gate of the second PMOS transistor of the first level CMOS phase inverter through the first resistor.

Optionally, the bias current source includes a third PMOS transistor which constitutes a mirror circuit with each of the second PMOS transistors of the N levels of CMOS phase inverters, such that the tail current sources of the N levels of CMOS phase inverters are current mirrors of the bias current source;

wherein a drain of the third PMOS transistor is connected to the ground through the bias current source, a source of the third PMOS transistor is connected to the sources of the second PMOS transistors of the N levels of CMOS phase inverters, and a gate of the third PMOS transistor is connected to the gates of the second PMOS transistors of the CMOS phase inverters from the second level to the $N^{th}$ level.

Optionally, the loop oscillator has a free oscillation frequency configured to be adjusted by controlling magnitudes of the tail current sources.

Optionally, the frequency of the clock input clock inputted by the frequency injection source is close to a free oscillation frequency of the loop oscillator enough to induce injection locking.

Optionally, frequencies of clock output signals outputted by the N levels of CMOS phase inverters of the loop oscillator are the same as the frequency of the clock input clock inputted by the frequency injection source, and phase differences of each pair of the clock output signals outputted by each pair of the neighboring CMOS phase inverters are the same.

The multi-phase clock generator in embodiments of the present disclosure uses injection locking effect to realize phase locking. Compared with DLL in which a phase detector and a charge pump shall be used to achieve phase locking, embodiments of the present disclosure can reduce phase noise raised by the charge pump. Therefore, in embodiments of the present disclosure, the phase noise of the generator after injection locking ideally depends on the noise and noise floor of the clock input signal, which means the phase noise of the generator can be reduced. Further, embodiments of the present disclosure don't have mismatch raised by the introduction of a charge pump, nor have the load asymmetry in DLL. Therefore, spur characteristics of the multi-phase generator are less severe as DLL.

BRIEF DESCRIPTION OF THE DRAWINGS

Hereinafter embodiments of the present disclosure will be illustrated in detail with reference to the accompanying drawings.

DETAILED DESCRIPTION OF THE DISCLOSURE

Figure 1:
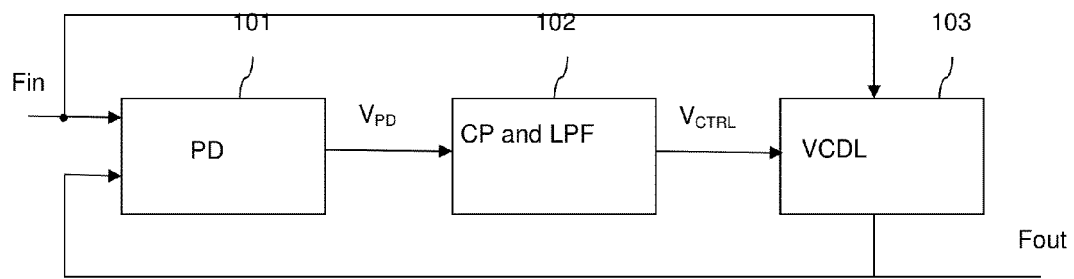
FIG. 1 schematically illustrates a conventional DLL.
Figure 2:
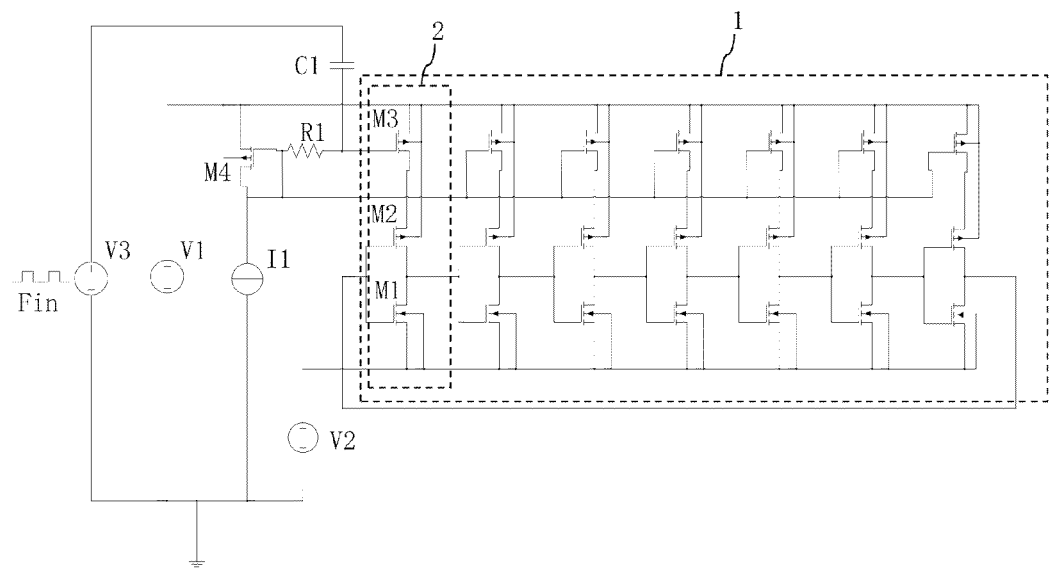
FIG. 2 schematically illustrates a circuit diagram according to one embodiment of the present disclosure.

FIG. 2 schematically illustrates a circuit diagram of one embodiment. Referring to FIG. 2, a multi-phase clock generator provided in the present disclosure may include a loop oscillator 1, a RC oscillator, a bias current source I1 and a frequency injection source V3.

The loop oscillator 1 includes a plurality of CMOS phase inverters 2. The CMOS phase inverters 2 have several levels, and the number of the levels is odd and greater than 1. In FIG. 2, there are seven levels of CMOS phase inverters 2 illustrated. However, the level number is not limited to 7. As stated above, any number which is odd and greater than 1 can be set as the level number of the CMOS phase inverters 2. The CMOS phase inverters 2 are connected in series and in a loop. Specifically, in the loop oscillator 1, the input end of the phase inverter in the $i^{th}$ level is connected to the output end of the phase inverter in the $(i-1)^{th}$ level, while its output end is connected to the input end of the phase inverter in the $(i+1)^{th}$ level. And the output end of the phase inverter in the final level is connected to the input end of the phase inverter in the first level.

The multi-level CMOS phase inverters 2 have the same structure between different levels. In each level, there is a CMOS phase inverter main body and a tail current source. The tail current source is a current mirror of the bias current source. The free oscillation frequency of the loop oscillator 1 can be adjusted by controlling the value of the current mirror.

In some embodiments, the CMOS phase inverter main body of each of the CMOS phase inverters 2 includes a first NMOS transistor M1 and a first PMOS transistor M2 connected with the first NMOS transistor M1, and the tail current source thereof is constituted by a second PMOS transistor M3. Gates of the first NMOS transistor M1 and the first PMOS transistor M2 are connected and serve as the input end of the CMOS phase inverter 2. Drains of the first NMOS transistor M1 and the first PMOS transistor M2 are connected and serve as the output end of the CMOS phase inverter 2. A source of the first PMOS transistor M2 is connected to a drain of the second PMOS transistor M3.

All the sources of the first NMOS transistors M1 of the multi-level CMOS phase inverters 2 are connected together and grounded. In FIG. 2, it is illustrated that the sources of the first NMOS transistors M1 in the multi-level inverters 2 are grounded through a voltage source V2. In some embodiments, the sources of the first NMOS transistors M1 in the multi-level inverters 2 can be directly grounded without the voltage source V2.

All the sources of the second PMOS transistors M3 in the multi-level inverters 2 are connected together and connected with a voltage source V1.

All the gates of the second PMOS transistors M3 of the phase inverters 2 from the second level to the final level are connected together, and are connected to the gate of the second PMOS transistor M3 of the phase inverter 2 in the first level with a first resistor R1 disposed therebetween.

The RC filter includes a first capacitor C1 and the first resistor R1 connected in series.

The frequency injection source V3 inputs a clock input signal Fin which is then injected through the first capacitor C1 into the tail current source of the CMOS phase inverter 2 in the first level. The clock input signal Fin is isolated, by the RC filter, from the bias current source I1 and the tail current sources in the loop oscillator 1 from the second level to the final level. By injecting the clock input signal Fin into the tail current source of the CMOS phase inverter in the first level, injection locking is implemented in the whole loop oscillator 1. Injection locking represents the frequency effect that can occur when a harmonic oscillator is disturbed by a second oscillator operating at a nearby frequency. When the coupling is strong enough and the frequencies are near enough, the second oscillator can capture the first oscillator. Therefore, the frequency of a clock output signal outputted by the loop oscillator 1 equals to the frequency of the clock input signal Fin inputted by the frequency injection source.

In some embodiments, the bias current source may include a third PMOS transistor M4 which constitutes mirror circuits respectively with the second PMOS transistors M3 in the multi-level CMOS phase inverters. In such configuration, the tail current sources can sever as current mirrors of the bias current source I1.

The drain of the third PMOS transistor M4 is connected to the ground through the bias current source I1, the source of the third PMOS transistor M4 is connected to the sources of the second PMOS transistors M3 in all levels, and the gate of the third PMOS transistor M4 is connected to the gates of the second PMOS transistors M3 from the second level to the final level.

The frequency injection source V3 is connected to the gate of the second PMOS transistor of the CMOS phase inverter 2 in the first level through the first capacitor C1, and further connected to the gates of the gates of the second PMOS transistors M3 from the second level to the final level and the gate of the third PMOS transistor M4 through the first capacitor C1 and the first resistor R1 which are connected in series. In such configuration, the clock input signal Fin is injected only through the tail current of the loop oscillator 1. The clock input signal Fin is isolated, by the RC filter, from the bias current source I1 and the tail current sources in the loop oscillator 1 from the second level to the final level. Therefore, under the effect of injection locking, the gate voltage of the second PMOS transistor M3 in the first level of the loop oscillator 1 will change with the clock input signal Fin, while the gate voltages of the second PMOS transistors M3 from the second level to the final level of the loop oscillator 1 remain stable.

The frequency of the clock input signal Fin inputted by the frequency injection source V3 is close enough to the free oscillation frequency of the loop oscillator 1, so as to meet the requirement of generating an injection locking.

All the multi-level CMOS phase inverters 2 of the loop oscillator 1 output clock output signals with the same frequency which equals to the frequency of the clock input signal Fin inputted by the frequency injection source V3. The phase difference between the clock signals outputted by each pair of neighboring CMOS phase inverters keeps unchanged.

In some embodiments, the second PMOS transistors M3 in all levels of the loop oscillator 1 are mirror circuits of the third PMOS transistor M4, which provide the tail currents for the multi-level CMOS phase inverters 2, respectively. Further, the tail current sources are current mirrors of the bias current source I1. In such way, magnitudes of the tail currents can be controlled by controlling the bias current source I1, and thus the free oscillation frequency of the loop oscillator 1 becomes controllable.

The source of the second PMOS transistor M3, i.e., the tail current source in the first level is injected with the clock input signal Fin which has a frequency close to the free oscillation frequency of the loop oscillator 1. Therefore, under the effect of injection locking, the frequency of the clock signal outputted by the loop oscillator can be locked to be the same as the frequency of the clock input signal Fin.

The injected clock input signal Fin is applied to the first level tail current source of the loop oscillator 1, i.e., applied to the gate of the second PMOS transistor M3 of the first level CMOS phase inverter 2, through the first capacitor C1. Further, through the RC filter consisting of the first capacitor C1 and the first resistor R1, the injected clock input signal Fin is applied to the bias current source, i.e., the gate of the third PMOS transistor M4 of the current source I1, and applied to the gates of the second PMOS transistors M3 in all the CMOS phase inverters 2 except the first level inverter. Therefore, the second PMOS phase inverters M3 of the CMOS phase inverters 2 except the first level inverter may have reduced gate oscillation magnitudes.

In the present disclosure, due to the inherent characteristics of the loop oscillator 1, the phase shifts generated by all the CMOS phase inverters 2 are the same, such that multi-phase clock signals with the same frequency can be outputted.

Since no phase detector or charge pump is used in embodiments of the present disclosure, phase noise raised by using a charge pump can be avoided. Therefore, embodiments of the present disclosure can have phase noise even lower than that of a DLL.

Ideally, in embodiments of the present disclosure, the phase noise of the generator after injection locking depends on the noise and noise floor of the clock input signal Fin, which means the phase noise of the generator can be reduced.

Figure 3:
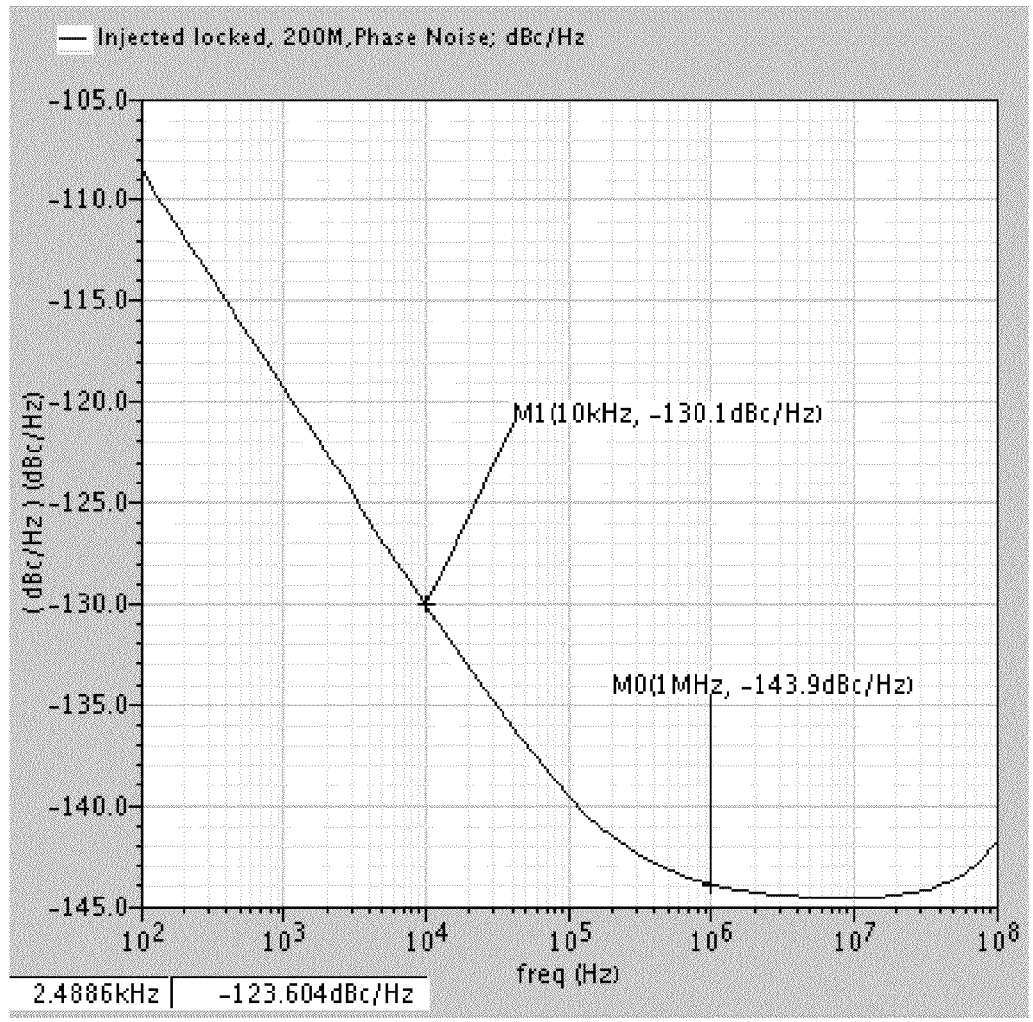
FIG. 3 schematically illustrates a phase noise curve of a multi-phase clock generator after injection locking according to one embodiment of the present disclosure.
Figure 4:
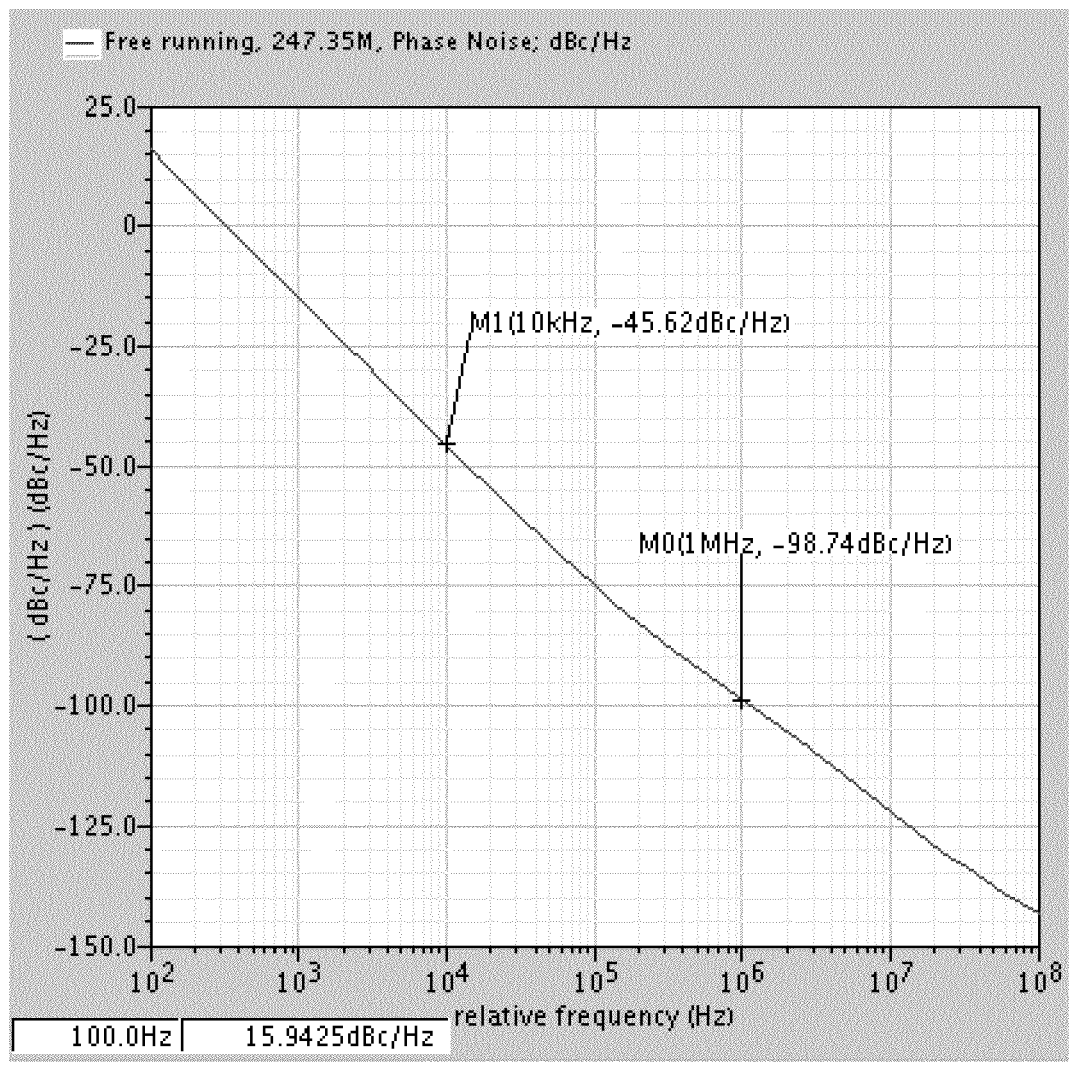
FIG. 4 schematically illustrates a phase noise curve in the free oscillation of a loop oscillator according to one embodiment of the present disclosure.

FIG. 3A schematically illustrates a phase noise curve of a multi-phase clock generator after injection locking according to one embodiment of the present disclosure, with the injection frequency being 200 MHz. FIG. 3B schematically illustrates a phase noise curve in the free oscillation of a loop oscillator according to one embodiment of the present disclosure, with the free oscillation frequency being 247.35 MHz. In the phase noise curve diagrams, horizontal axes represent the frequency in hertz, and vertical axes represent the phase noise in dBc/Hz. By comparing the two phase noise curves, it could be concluded that after the injection locking, the phase noise is tremendously reduced. In the curves, the phase noises corresponding to two frequencies 10 KHz and 1 MHz are illustrated.

Further, embodiments of the present disclosure don't have mismatch raised by the introduction of a charge pump, nor have the load asymmetry in DLL. Therefore, spur characteristics of the multi-phase generator are less severe as DLL.

The disclosure is disclosed, but not limited, by preferred embodiments as above. Based on the disclosure of the disclosure, those skilled in the art can make any variation and modification without departing from the scope of the disclosure. Therefore, any simple modification, variation and polishing based on the embodiments described herein is within the scope of the present disclosure.

What is claimed is:

1. A multi-phase clock generator, comprising:
   a loop oscillator, a RC filter, a bias current source and a frequency injection source;
   wherein the loop oscillator comprises N levels of CMOS phase inverters which are connected in series and form a loop, N represents an odd number greater than 1;
   wherein the N levels of CMOS phase inverters have the same structures, each of which comprises a CMOS phase inverter main body and a tail current source which is a current mirror of the bias current source;
   wherein an input end of the $i^{th}$ level CMOS phase inverter is connected to an output end of the $(i-1)^{th}$ level CMOS phase inverter, an output end of the $i^{th}$ level CMOS phase inverter is connected to an input end of the $(i+1)^{th}$ level CMOS phase inverter, and an input end of the first level CMOS phase inverter is connected to an output end of the $N^{th}$ level CMOS phase inverter, i represents an integral number greater than 1 and less than N;
   wherein the RC filter comprises a first capacitor and a first resistor;
   wherein the frequency injection source is adapted for inputting a clock input signal which is then injected through the first capacitor to the tail current source of the first level CMOS phase inverter;
   wherein the clock input signal is isolated, by the RC filter, from the bias current source and the tail current sources of the CMOS phase inverters from the second level to the $N^{th}$ level of the loop oscillator;
   wherein the loop oscillator outputs a clock output signal whose frequency is the same as a frequency of the clock input signal inputted by the frequency injection source under the effect of injection locking.

2. The multi-phase clock generator according to claim 1, wherein each of the CMOS phase inverter main bodies comprises a first NMOS transistor and a first PMOS transistor, and each of the tail current sources comprises a second PMOS transistor;

wherein gates of the first NMOS transistor and the first PMOS transistor are connected to a node which also serves as the input end of the CMOS phase inverter, drains of the first NMOS transistor and the first PMOS transistor are connected to a node which also serves as the output end of the CMOS phase inverter, and a source of the first PMOS transistor is connected to a drain of the second PMOS transistor;

wherein sources of the first NMOS transistors of the N levels of CMOS phase inverters are connected and grounded;

wherein sources of the second PMOS transistors of the N levels of CMOS phase inverters are connected to a power supply voltage;

wherein gates of the second PMOS transistors of the CMOS phase inverters from the second level to the N$^{th}$ level are connected to a node which is connected to a gate of the second PMOS transistor of the first level CMOS phase inverter through the first resistor.

3. The multi-phase clock generator according to claim 2, wherein the bias current source comprises a third PMOS transistor which constitutes a mirror circuit with each of the second PMOS transistors of the N levels of CMOS phase inverters, such that the tail current sources of the N levels of CMOS phase inverters are current mirrors of the bias current source;

wherein a drain of the third PMOS transistor is connected to the ground through the bias current source, a source of the third PMOS transistor is connected to the sources of the second PMOS transistors of the N levels of CMOS phase inverters, and a gate of the third PMOS transistor is connected to the gates of the second PMOS transistors of the CMOS phase inverters from the second level to the N$^{th}$ level.

4. The multi-phase clock generator according to claim 1, wherein the loop oscillator has a free oscillation frequency configured to be adjusted by controlling magnitudes of the tail current sources.

5. The multi-phase clock generator according to claim 2, wherein the loop oscillator has a free oscillation frequency configured to be adjusted by controlling magnitudes of the tail current sources.

6. The multi-phase clock generator according to claim 3, wherein the loop oscillator has a free oscillation frequency configured to be adjusted by controlling magnitudes of the tail current sources.

7. The multi-phase clock generator according to claim 1, wherein the frequency of the clock input clock inputted by the frequency injection source is close to a free oscillation frequency of the loop oscillator enough to induce injection locking.

8. The multi-phase clock generator according to claim 2, wherein the frequency of the clock input clock inputted by the frequency injection source is close to a free oscillation frequency of the loop oscillator enough to induce injection locking.

9. The multi-phase clock generator according to claim 3, wherein the frequency of the clock input clock inputted by the frequency injection source is close to a free oscillation frequency of the loop oscillator enough to induce injection locking.

10. The multi-phase clock generator according to claim 4, wherein the frequency of the clock input clock inputted by the frequency injection source is close to the free oscillation frequency of the loop oscillator enough to induce injection locking.

11. The multi-phase clock generator according to claim 5, wherein the frequency of the clock input clock inputted by the frequency injection source is close to the free oscillation frequency of the loop oscillator enough to induce injection locking.

12. The multi-phase clock generator according to claim 6, wherein the frequency of the clock input clock inputted by the frequency injection source is close to the free oscillation frequency of the loop oscillator enough to induce injection locking.

13. The multi-phase clock generator according to claim 1, wherein frequencies of clock output signals outputted by the N levels of CMOS phase inverters of the loop oscillator are the same as the frequency of the clock input clock inputted by the frequency injection source, and phase differences of each pair of the clock output signals outputted by each pair of the neighboring CMOS phase inverters are the same.

14. The multi-phase clock generator according to claim 2, wherein frequencies of clock output signals outputted by the N levels of CMOS phase inverters of the loop oscillator are the same as the frequency of the clock input clock inputted by the frequency injection source, and phase differences of each pair of the clock output signals outputted by each pair of the neighboring CMOS phase inverters are the same.

15. The multi-phase clock generator according to claim 3, wherein frequencies of clock output signals outputted by the N levels of CMOS phase inverters of the loop oscillator are the same as the frequency of the clock input clock inputted by the frequency injection source, and phase differences of each pair of the clock output signals outputted by each pair of the neighboring CMOS phase inverters are the same.

* * * * *